(12) United States Patent
Holland et al.

(10) Patent No.: US 9,653,288 B1
(45) Date of Patent: May 16, 2017

(54) METHOD OF FORMING ULTRA-THIN NANOWIRES

(71) Applicant: Taiwan Semiconductor Manufacturing Company, Ltd., Hsin-Chu (TW)

(72) Inventors: Martin Christopher Holland, Bertem (BE); Blandine Duriez, Brussels (FR)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/941,909

(22) Filed: Nov. 16, 2015

(51) Int. Cl.
  *H01L 21/02* (2006.01)
  *H01L 21/306* (2006.01)
  *H01L 21/311* (2006.01)
  *H01L 29/06* (2006.01)

(52) U.S. Cl.
  CPC .... *H01L 21/02603* (2013.01); *H01L 21/0262* (2013.01); *H01L 21/02532* (2013.01); *H01L 21/02543* (2013.01); *H01L 21/02546* (2013.01); *H01L 21/02549* (2013.01); *H01L 21/02639* (2013.01); *H01L 21/30604* (2013.01); *H01L 21/31116* (2013.01); *H01L 29/0676* (2013.01)

(58) Field of Classification Search
  CPC ........... H01L 21/02603; H01L 29/0676; H01L 21/02639
  See application file for complete search history.

(56) References Cited

U.S. PATENT DOCUMENTS

2015/0145042 A1* 5/2015 Bu ................. H01L 27/1211
  257/347
2016/0172246 A1* 6/2016 van Dal ............ H01L 21/02532
  438/268

OTHER PUBLICATIONS

K. Tomioka et al., "Growth of Highly Uniform InAs NanoWire Arrays by Selective-Area MOVPE," Journal of Crystal Growth, vol. 298 (2007), pp. 644-647.
Alireza Alian et al., "InGaAs MOS Transistors Fabricated through a Digital-Etch Gate-Recess Process and the Influence of Forming Gas Anneal on Their Electrical Behavior," ECS Journal of Solid State Science and Technology, vol. 1, Issue 6, (2012) The Electrochemical Society, pp. P310-P314.

* cited by examiner

*Primary Examiner* — Daniel Luke
(74) *Attorney, Agent, or Firm* — Haynes and Boone, LLP

(57) ABSTRACT

Provided is a method of forming a nanowire-based device. The method includes forming a first mask layer over a substrate; forming a first opening in the first mask layer; growing a first nanowire that protrudes through the first opening in the first mask layer, wherein the first nanowire has a first diameter; removing the first mask layer; oxidizing a sidewall of the first nanowire; etching the oxidized sidewall of the first nanowire; forming a second mask layer overlaying the substrate; removing the first nanowire thereby forming a second opening in the second mask layer; and growing a second nanowire that protrudes through the second opening in the second mask layer, wherein the second nanowire has a second diameter and the second diameter is different than the first diameter.

19 Claims, 12 Drawing Sheets

METHOD OF FORMING ULTRA-THIN NANOWIRES

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, functional density (i.e., the number of interconnected devices per chip area) has generally increased while geometry size (i.e., the smallest component (or line) that can be created using a fabrication process) has decreased. Despite advances in materials and fabrication, in order to further decrease the geometry size, conventional planar MOSFET devices have encountered challenges. As such, a variety of devices that are not planarity-based or include non-planar components have attracted attention such as, for example, a Fin FET device, a vertical FET, etc.

While a variety of techniques to fabricate a non-planar device (e.g., a vertical FET) have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
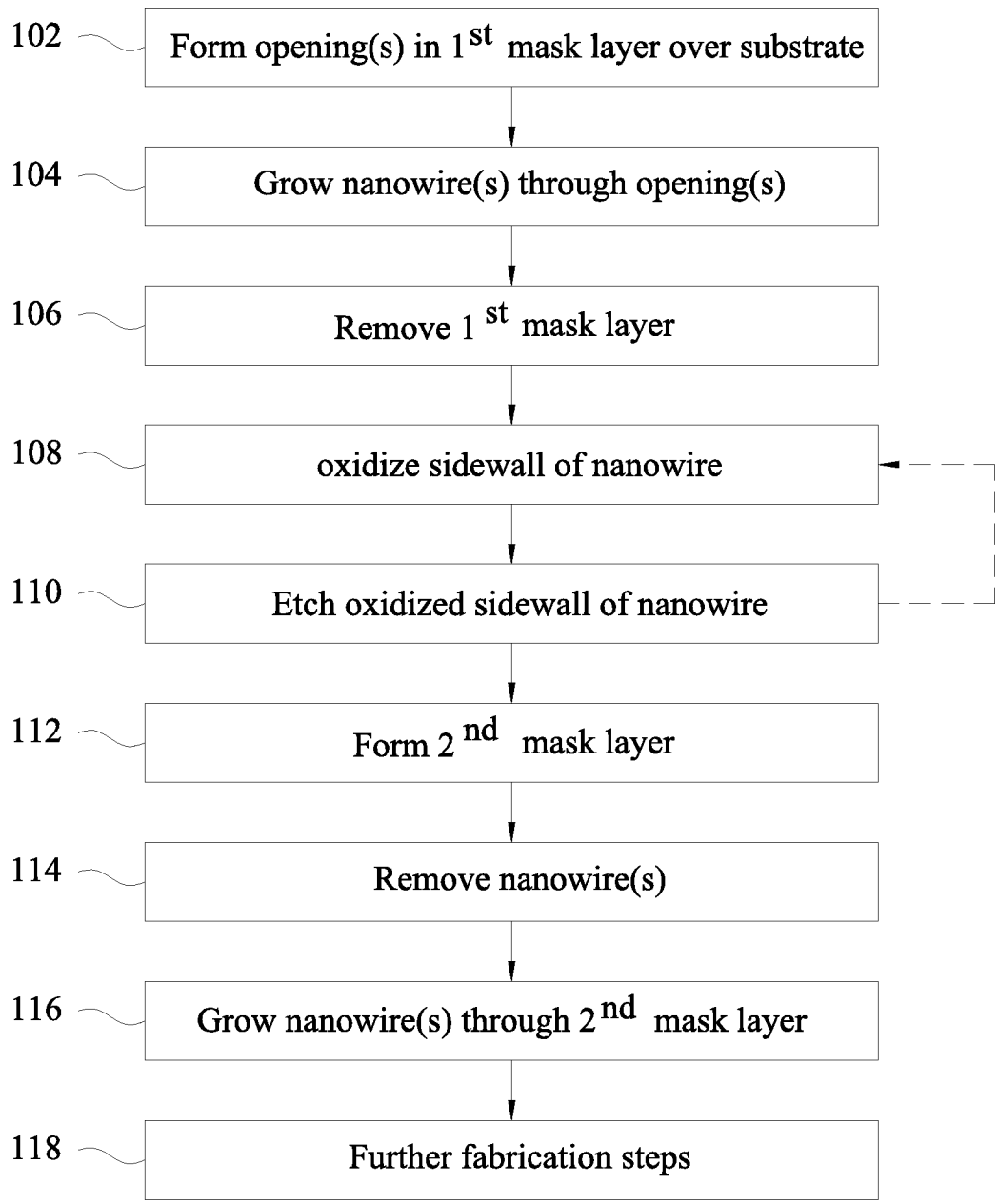
FIG. 1 depicts a method of fabricating a nanowire-based device in accordance with various embodiments.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 is a flowchart of a method 100 of forming a nanowire-based device 200 with an ultrathin diameter constructed according to various aspects of the present disclosure in one or more embodiments. The method 100 is described with reference to FIG. 1 and in conjunction with FIGS. 2A, 2B, 2C, 2D, 2E, 2F, 2G, and 2H. FIGS. 2A-2H are cross sectional views of forming the nanowire-based device 200 by the method 100 according to some embodiments. In some embodiments, the nanowire-based device 200 fabricated according to the disclosed method 100 may be an element of a field-effect-transistor (FET). For example, the nanowire-based device may form a channel, a source feature, and/or a drain feature of a vertical FET. It is understood that additional steps can be provided before, during, and/or after the method 100, and some of the steps described can be replaced, eliminated, and/or moved around for additional embodiments of the method 100.

As discussed above, method 100 discloses forming a nanowire-based device 200 with an ultrathin diameter. Generally, ultrathin diameter refers to diameter not greater than about 10 nanometers. Ultrathin nanowires are important because a nanowire-based device with such ultrathin nanowires may result in better performance of the device as a whole such as, for example, higher switching speed, lower leakage current, lower contact resistance, etc. This is especially true in non-planar devices.

Figure 2A:
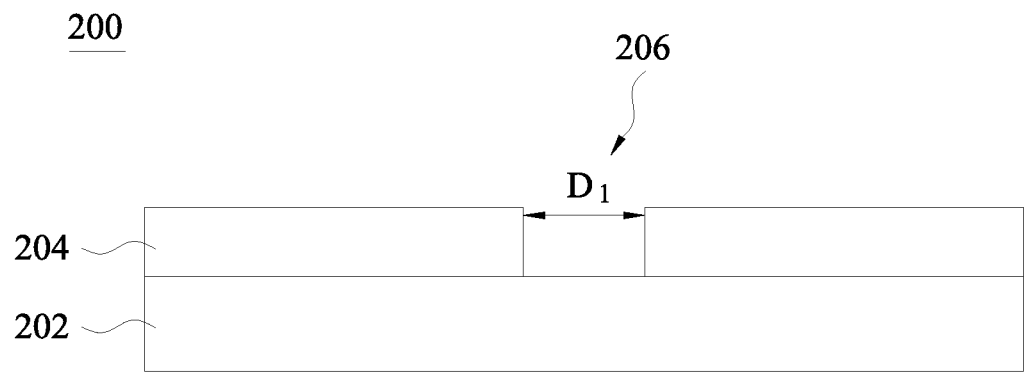
FIGS. 2A, 2C, 2D, 2E, 2F, 2G, 2H, 2I, and 2J depict cross-sectional views of a nanowire-based device fabricated by the method of FIG. 1 in accordance with various embodiments.

Referring to FIGS. 1 and 2A, method 100 begins at operation 102 by providing a substrate 202 overlaid by a mask layer 204 with an opening 206. In an embodiment, the substrate 202 is a semiconductor substrate and includes silicon. Alternatively, the substrate includes germanium, silicon germanium and/or other semiconductor materials such as III/V materials (e.g., InAs, GaAs, InP, GaN, etc.). In another embodiment, the substrate 202 may include a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Regarding the mask layer 204, in accordance with some embodiments, the mask layer 204 may be formed of a dielectric layer such as, for example, silicon nitride ($SiN_x$) and/or silicon oxide ($SiO_x$). The mask layer 204 may be formed by using any of a variety of deposition processes such as, for example, a physical vapour deposition (PVD) process, a chemical vapour deposition (CVD) process, and/or an atomic layer deposition (ALD) process. In the current embodiment, the opening 206 extending through mask layer 204 may be formed by using one of a variety of approaches that are suitable to form an opening with a well-controlled size (e.g., diameter) and position through the mask layer. For example, the opening 206 may be formed by using an electron beam lithography (EBL), a nanoimprint lithography, an optical lithography and a reactive ion etching (RIE) and/or a wet chemical etching method.

Figure 2B:
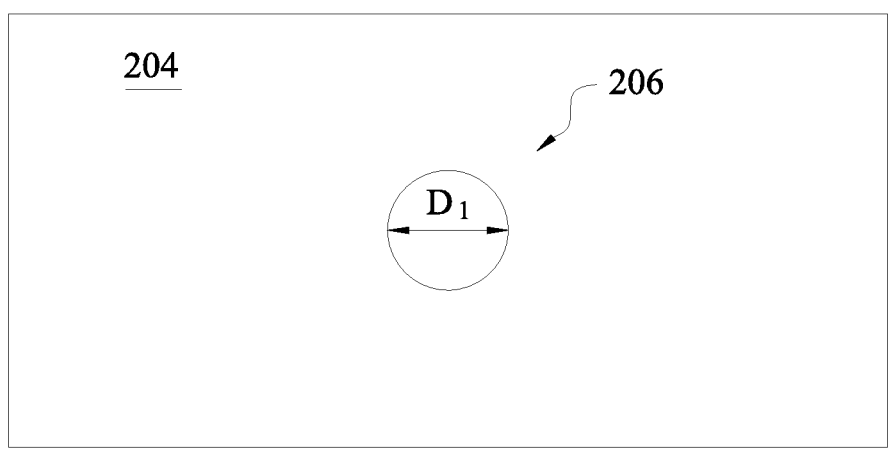
FIG. 2B depicts a top view of a nanowire-based device fabricated by the method of FIG. 1 in accordance with various embodiments.

According to the current embodiment, opening 206, from a top view, has a curvilinear shape (e.g., a circle) as shown in FIG. 2B. As such, the opening 206 may have a diameter $D_1$. In some embodiments, the diameter $D_1$ may range between about 15 nanometers to about 100 nanometers. While the opening 206 is described as a circle in the current embodiment, the opening 206 may have any of a variety of shapes, which may vary according to the approach of forming the opening 206.

Figure 2C:
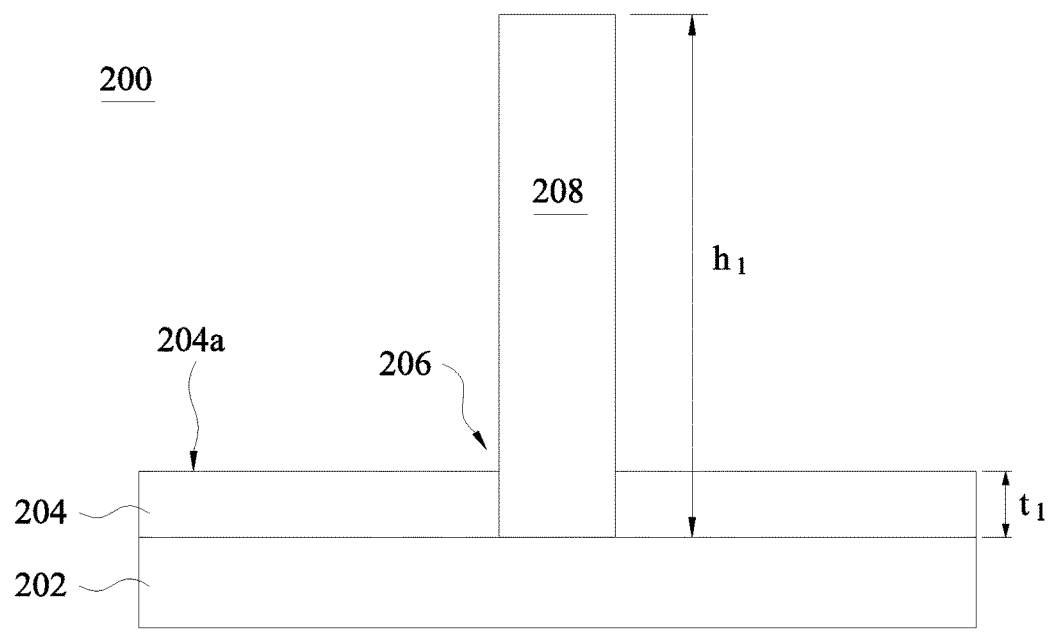

Referring to FIGS. 1 and 2C, method 100 proceeds to operation 104 by forming a nanowire 208 from the substrate 202 that extends through the opening 206 in mask layer 204. As shown in the illustrated embodiment of FIG. 2C, the formed nanowire 208 protrudes from (or extends beyond) top surface 204a of the mask layer 204. That is, in some embodiments, nanowire 208 has a height $h_1$ that is greater than a thickness $t_1$ of the mask layer 204. In other embodiments, the height of the nanowire 208 may be less than the thickness of the mask layer 204. According to some embodiments, the nanowire 208 may be formed of a material that is either the same as or different than the material of the substrate 202. In an example, the nanowire 208 may be formed of III/V or II-VI compound materials (e.g., InAs, GaAs, InP, GaN, etc.) while the material of the substrate is formed of silicon. In another example, the nanowire 208 may be formed of silicon while the material of the substrate is also formed of silicon. Yet in another example, the nanowire 208 may be formed of silicon with a first crystalline orientation (e.g., <111>) while the material of the substrate is also formed of silicon but with a second crystalline orientation (e.g., <001>). As such, the nanowire 208 may include at least one of a variety of materials such as, for example, silicon, germanium, InAs, InP, GaAs, GaSb, InSb, GaP, InGaAs, InGaP, and/or a combination thereof. In a specific embodiment, the forming the nanowire 208 through the opening 206 may include a selective area growth metal organic chemical vapour deposition (SAG-MOCVD) or metal organic vapour phase epitaxy (SAG-MOVPE) growth. In other embodiments, forming the nanowire 208 may include any of a variety of deposition approaches (e.g., CVD, MOCVD) and remain within the scope of the present disclosure. In an embodiment, since the nanowire 208 is formed within opening 206 in the mask layer 204, the nanowire 208 includes a curvilinear cross-section (i.e. circular shape) and such a curvilinear nanowire 208 may include a diameter that is approximately the same as the diameter $D_1$.

Figure 2D:
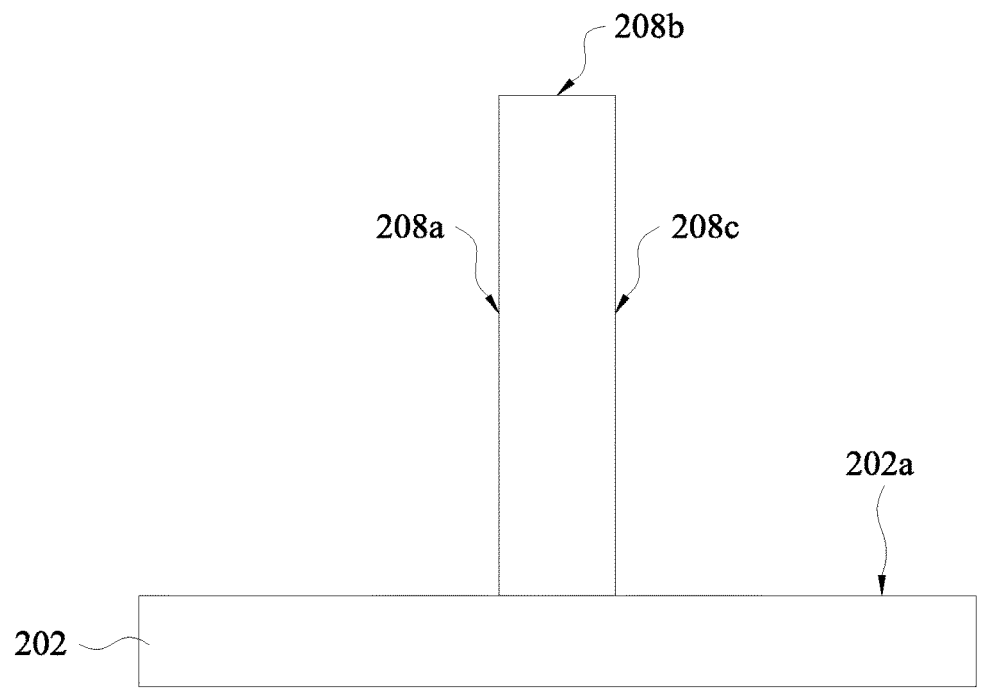

Referring now to FIGS. 1 and 2D, method 100 continues to block 106 with removing the mask layer 204. The removing the mask layer 204 may include a wet and/or a dry etching process. After the mask layer 204 is removed, top surface 202a of the substrate 202 is exposed. As such, surfaces 208a, 208b, and 208c of the nanowire 208, including lower portions of the sidewalls 208a and 208c that were covered by the mask layer 204, are exposed as well. In an example of using a wet etching process to remove the mask layer, chemicals, including but not limited to hydrogen fluoride (e.g., 2%), may be used.

Figure 2E:
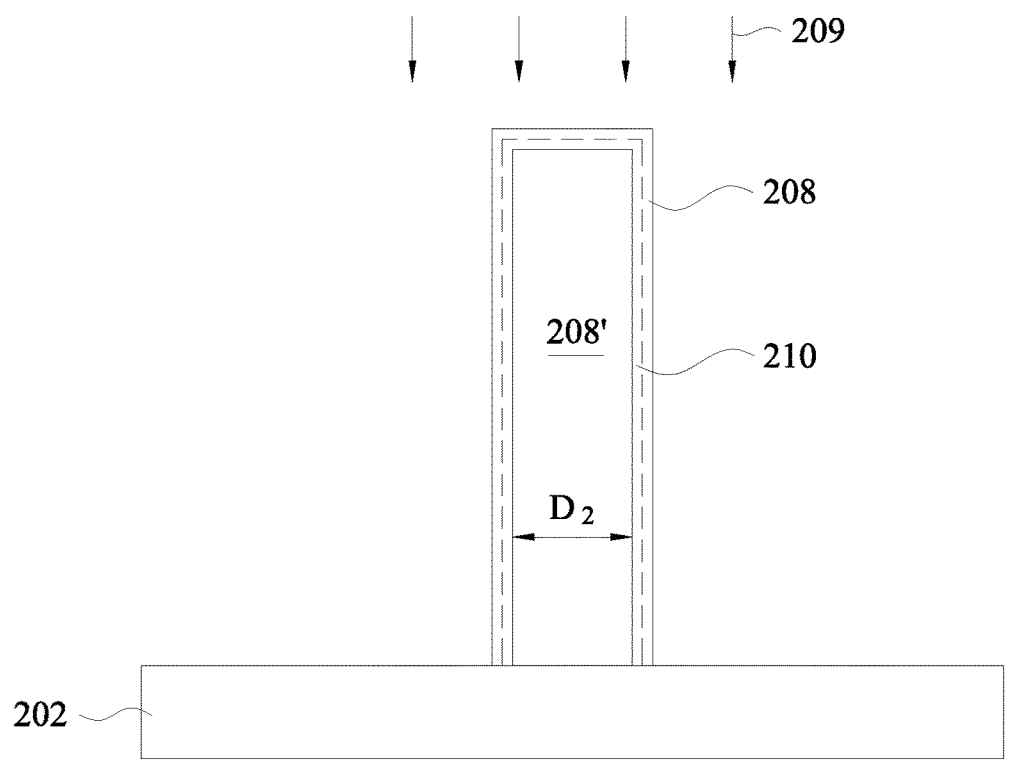

Referring now to FIGS. 1 and 2E, method 100 then proceeds to block 108 with oxidizing (operation 209 as illustrated in FIG. 2E) surfaces 208a, 208b, and 208c of the nanowire 208 thereby forming oxidized layer 210. In some embodiments, the oxidizing operation 209 may include one of a variety of oxidation processes such as, for example, placing the device 200 in an oxidizing chamber (e.g., a UV ozone chamber), placing the device 200 in an oxidizer (e.g., $H_2O_2$), and/or applying an oxidizer (e.g., $H_2O_2$) on the nanowire 208 to form the oxidized layer 210. In the illustrated embodiment of FIG. 2E, the oxidized layer 210 may extend inward and outward the surfaces of the nanowire 208 (the dotted line shown in FIG. 2E). That is, after the oxidizing operation 209, a nanowire 208' covered by the oxidized layer 210 may be formed. Moreover, such a newly formed nanowire 208' may have a diameter $D_2$ and the diameter of the nanowire 208' ($D_2$) is less than the diameter of the nanowire 208 ($D_1$). However, in some other embodiments, the diameter of the nanowire 208' ($D_2$) may be the same or greater than the diameter of the nanowire 208 ($D_1$).

Figure 2F:
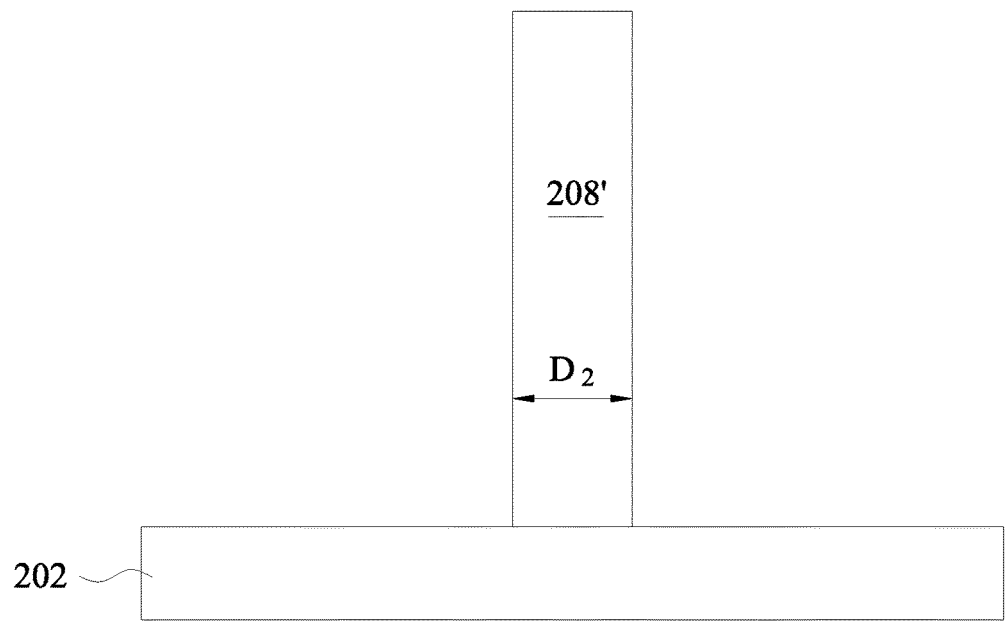

Referring now to FIGS. 1 and 2F, method 100 then proceeds to block 110 with etching the oxidized layer 210 such that, as illustrated in FIG. 2F, the nanowire 208' is exposed. In some embodiments, etching oxidized layer 210 may include applying an etching solution over the oxidized layer 210. One or more of a variety of etching solutions may be used, such as, for example, HCl, $NH_4OH$, $(NH_4)_2S$, etc. Generally, blocks 108 and 110 may be successively performed as a cycle, and each cycle may be performed iteratively so as a desired diameter $D_2$ is reached. Such an iteration process may be referred to as a digital etching process. Any number of iterations may be performed. In an example, if after one cycle performing the steps described in blocks 108 and 110, the diameter $D_2$ has reached a desired parameter the iteration process may be stopped and the process continues onto block 112. However, if the diameter $D_2$ has not reached a desired parameter, the iteration process may be continued, such as repeating the processes described in blocks 108 and 110 until the desired diameter of the nanowire 208' has been achieved.

Figure 2G:
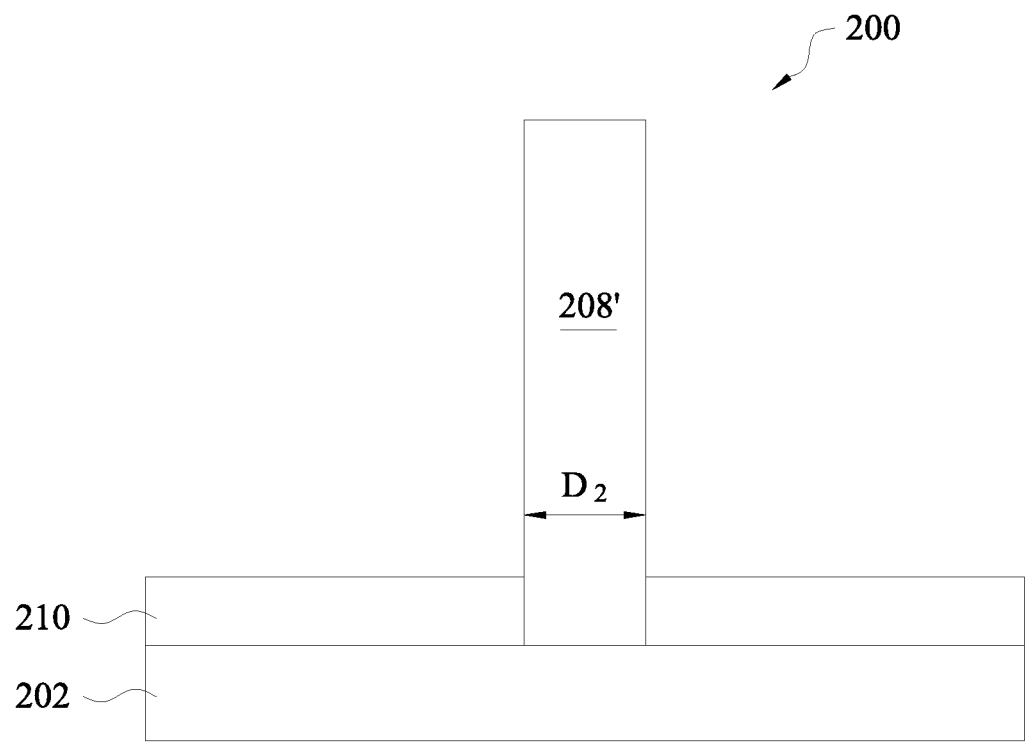

Referring now to FIGS. 1 and 2G, method 100 continues to block 112 with forming another mask layer 210 over the substrate 202. The mask layer 210 may be formed of a dielectric layer such as, for example, silicon nitride ($SiN_x$) and/or silicon oxide ($SiO_x$). Moreover, mask layer 210 may be formed of the same material or different material as mask layer 204. The mask layer 210 may be formed by using any of a variety of deposition processes such as, for example, a physical vapour deposition (PVD) process, a chemical vapour deposition (CVD) process, and/or an atomic layer deposition (ALD) process.

Figure 2H:
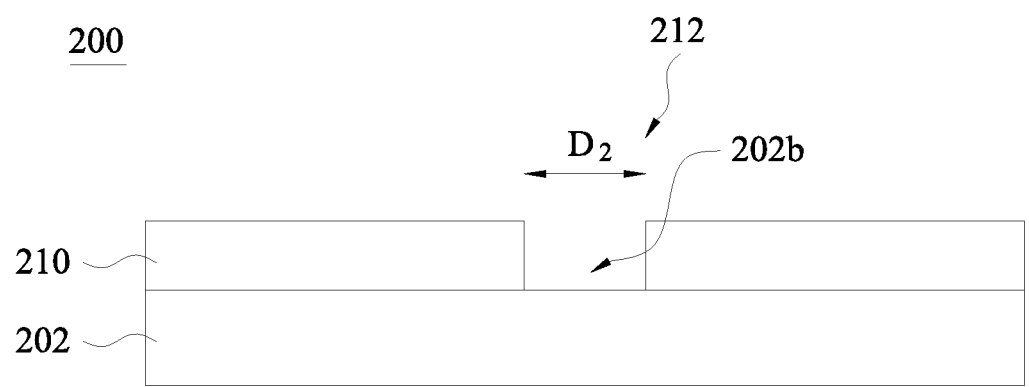

Referring now to FIGS. 1 and 2H, method 100 proceeds to block 114 by removing the nanowire 208'. One or more of a variety of processes may be used to remove the nanowire 208', which includes a thermal process, a wet etching process, and/or a dry etching process. In the example of using the thermal process to remove the nanowires 208' (e.g., InAs nanowire(s)) may include baking the substrate 202 to about 650° C. for about 5 minutes with a hydrogen flow. In another example of using the thermal process to remove GaAs nanowire(s), a higher temperature may be needed such as about up to 800° C. In the example of using the wet etching process to remove the nanowire 208' may include applying ammonia peroxide water mix (APM) onto the substrate 202 at about 80° C., whereby the APM may include $NH_4OH$, $H_2O_2$, and $H_2O$ that are mixed in a ratio of 1:1:5. After the removing the nanowire 208', an opening 212 having the diameter $D_2$ in the mask layer 210 is formed as illustrated in FIG. 2H. Opening 212 exposes a portion 202b of the top surface of the substrate 202.

Figure 2I:
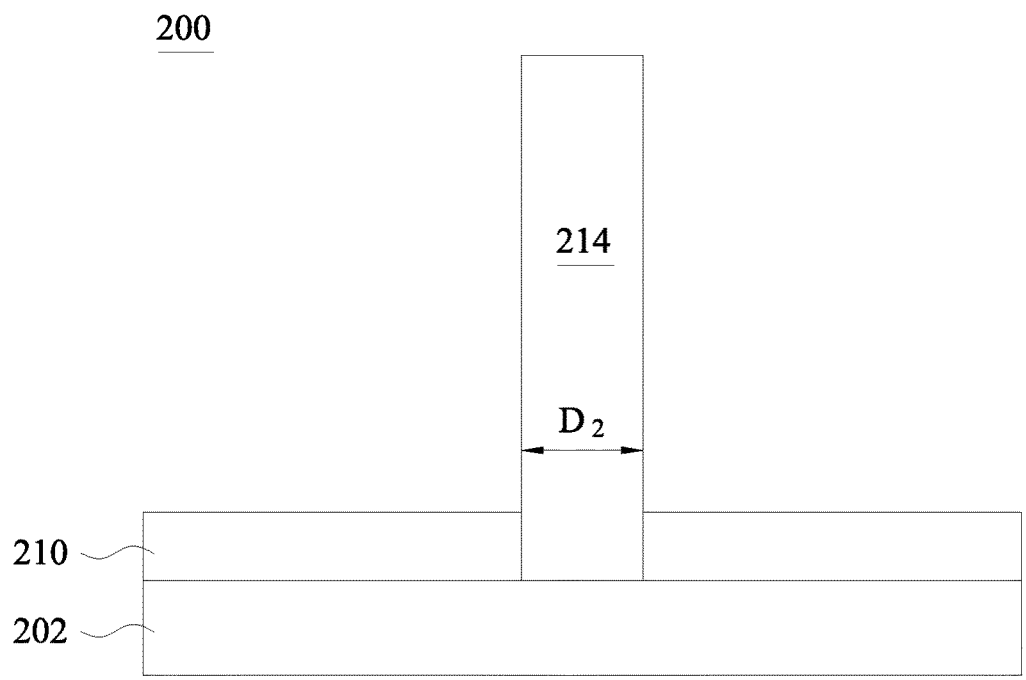

Referring now to FIGS. 1 and 2I, method 100 proceeds to block 116 with forming nanowire 214 through the opening 212 in the mask layer 210. According to some embodiments, the nanowire 214 may be formed of a material that is either the same or different than the material of the substrate 202 and the nanowire 208. In an example, the nanowire 214 may be formed of III/V or II-VI compound materials (e.g., InAs, GaAs, InP, GaN, etc.) while the material of the substrate is formed of silicon. In another example, the nanowire 214 may be formed of silicon while the material of the substrate is also formed of silicon. Yet in another example, the nanowire 214 may be formed of silicon with a first crystalline orientation (e.g., <111>) while the material of the substrate is also formed of silicon but with a second crystalline orientation (e.g., <001>). As such, the nanowire 214 may include at least one of a variety of materials such as, for example, silicon, germanium, InAs, InP, GaAs, GaSb, InSb, GaP, InGaAs, InGaP, or a combination thereof. In a specific embodiment, the forming the nanowire 214 through the opening 212 may include a selective area growth metal organic chemical vapour deposition (SAG-MOCVD) or metal organic vapour phase epitaxy (SAG-MOVPE) growth while any of a variety of deposition approaches (e.g., CVD, MOCVD) may be used and remaining within the scope of the present disclosure. In an embodiment, since the nanowire 214 is formed following the opening 212 in the mask layer 210, the nanowire 214 has a curvilinear cross-section (i.e. circular shape) and such a curvilinear nanowire 214 includes a diameter that is approximately the same as the diameter $D_2$.

Figure 2J:
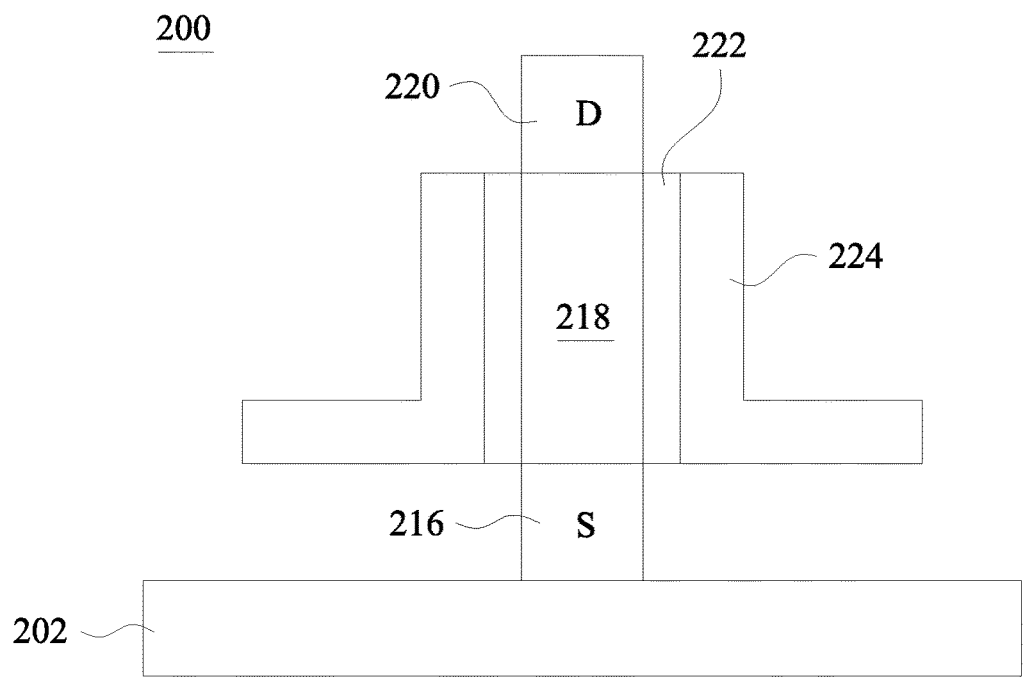

Referring to FIGS. 1 and 2J, method 100 may then proceed to block 118 that includes further fabrication steps. In an example in which the device 200 is a vertical FET, a source feature 216, a channel region 218, and a drain feature 220 may be formed in the nanowire 214. Accordingly, gate dielectric layer 222 and gate contact 224 may be formed to wrap the channel region 218. Such fabrication steps may result in the device 200 to be formed as an element of a vertical FET.

Figure 3:
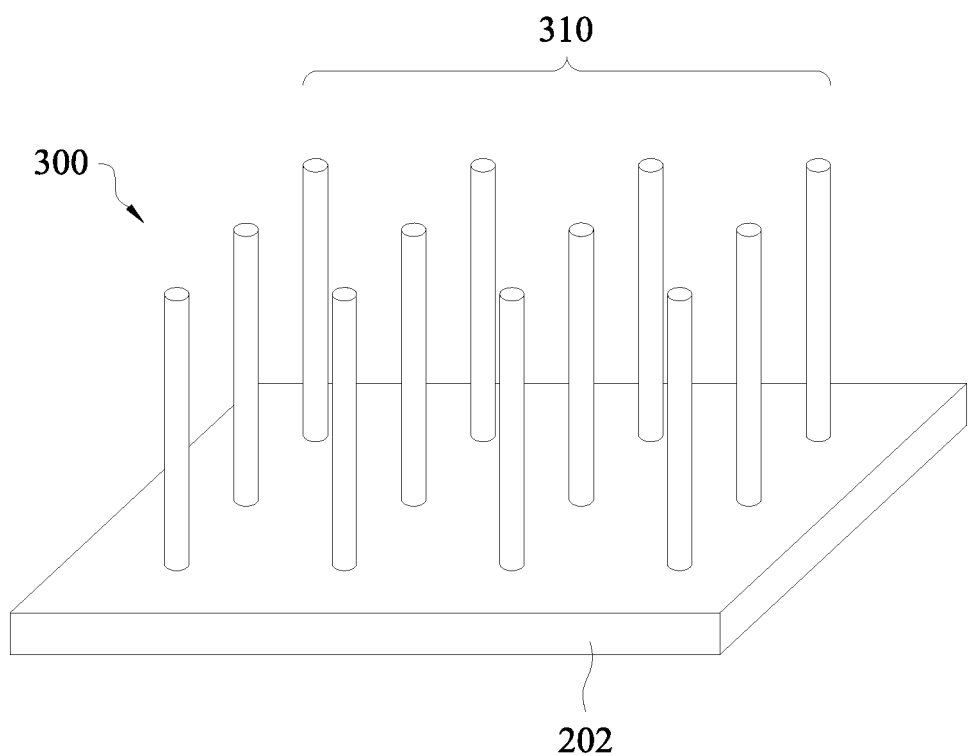
FIG. 3 depicts a perspective view of an array of nanowires fabricated by the method of FIG. 1 in accordance with various embodiments.

Additionally, referring now to FIG. 3, a nanowire-based device 300 that includes a plurality of nanowires 310 formed on the substrate 202 is illustrated. In an embodiment, such a plurality of nanowires 310 may form an array of nanowires. Such a nanowire-based device 300 may be formed using the embodiment of the method 100.

Figure 4:
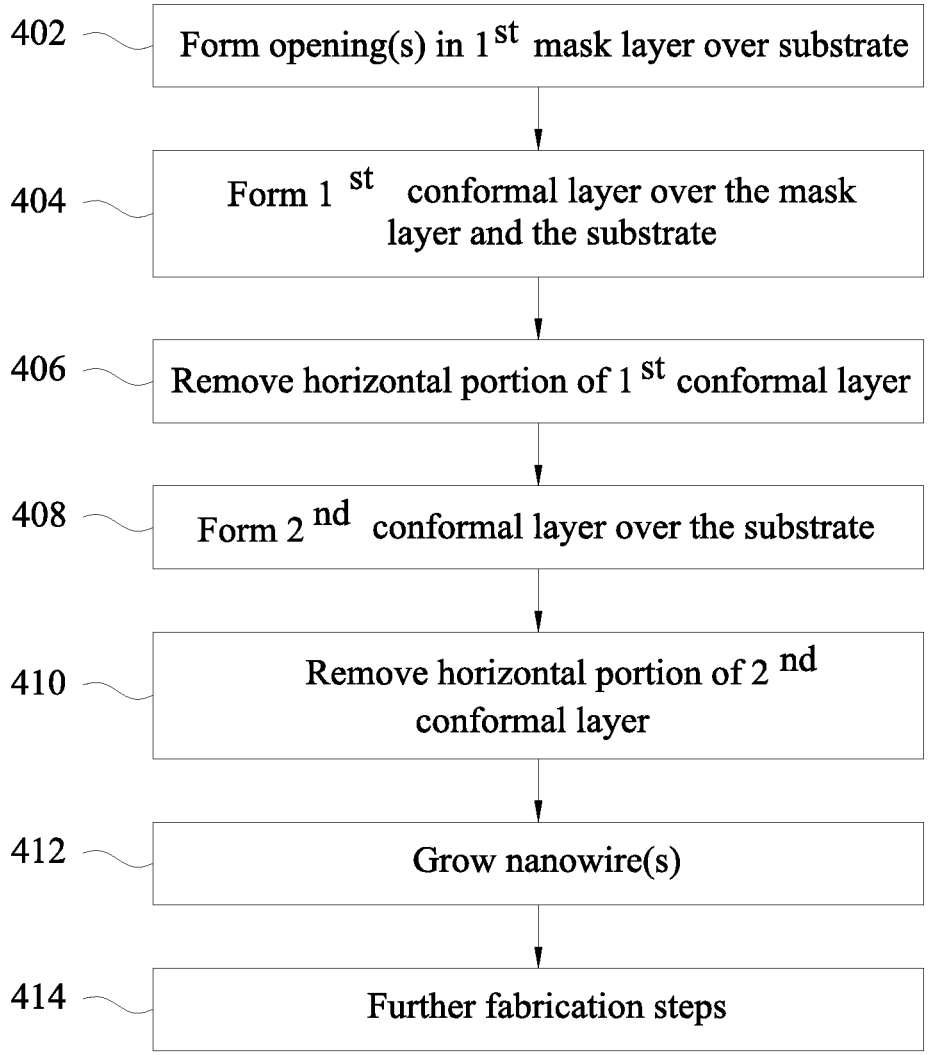
FIG. 4 depicts a method of fabricating a nanowire-based device in accordance with various embodiments.

FIG. 4 is a flowchart of a method 400 of forming a nanowire-based device 500 with ultrathin diameter constructed according to various aspects of the present disclosure in one or more embodiments. The method 400 is described with reference to FIG. 4 and in conjunction with FIGS. 5A, 5B, 5C, 5D, 5E, and 5F. FIGS. 5A-5F are cross sectional views of forming the nanowire-based device 500 by the method 400 according to some embodiments. In some embodiments, the nanowire-based device 500 fabricated according to the disclosed method 400 may be an element of a field-effect-transistor (FET). For example, the nanowire-based device may form a channel, a source feature, and/or a drain feature of a vertical FET. It is understood that additional steps can be provided before, during, and/or after the method 400, and some of the steps described can be replaced, eliminated, and/or moved around for additional embodiments of the method 400.

Figure 5A:
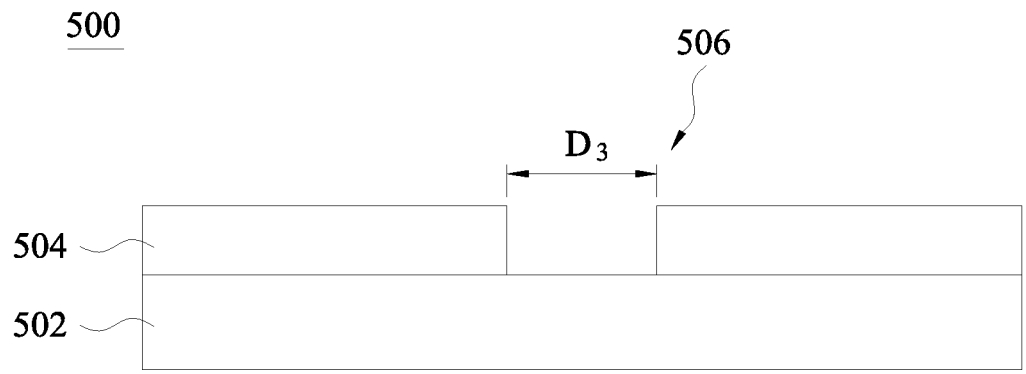
FIGS. 5A, 5B, 5C, 5D, 5E, 5F, and 5G depict cross-sectional views of a nanowire-based device fabricated by the method of FIG. 4 in accordance with various embodiments.

Referring to FIGS. 4 and 5A, method 400 begins at operation 402 with providing a substrate 502 overlaid by a mask layer 504 with an opening 506. In an embodiment, the substrate 502 is a semiconductor substrate and includes silicon. Alternatively, the substrate includes germanium, silicon germanium and/or other proper semiconductor materials such as III/V materials. In another embodiment, the substrate 502 may include a buried dielectric material layer for isolation formed by a proper technology, such as a technology referred to as separation by implanted oxygen (SIMOX). In some embodiments, the substrate 502 may be a semiconductor on insulator, such as silicon on insulator (SOI).

Regarding the mask layer 504, in accordance with some embodiments, the mask layer 504 may be formed of a dielectric layer such as, for example, silicon nitride ($SiN_x$) and/or silicon oxide ($SiO_x$). The mask layer 504 may be formed by using any of a variety of deposition processes such as, for example, a physical vapour deposition (PVD) process, a chemical vapour deposition (CVD) process, and/or an atomic layer deposition (ALD) process. In the current embodiment, the opening 506 extending through mask layer 504 may be formed by using one of a variety of approaches that are suitable to form an opening with a well-controlled size (e.g., diameter) and position through the mask layer. For example, the opening 506 may be formed by using an electron beam lithography (EBL), a nanoimprint lithography, an optical lithography and a reactive ion etching (RIE) and/or a wet chemical etching method.

According to the current embodiment, the opening 506, from a top view, has a curvilinear shape (e.g., a circle). As such, the opening 506 may have a diameter $D_3$. In some embodiments, the diameter $D_3$ may range between about 15 nanometers to about 100 nanometers. While the opening 506 is described as a circle in the current embodiment, the opening 506 may have any of a variety of shapes, which may vary according to the approach of forming the opening 506.

Figure 5B:
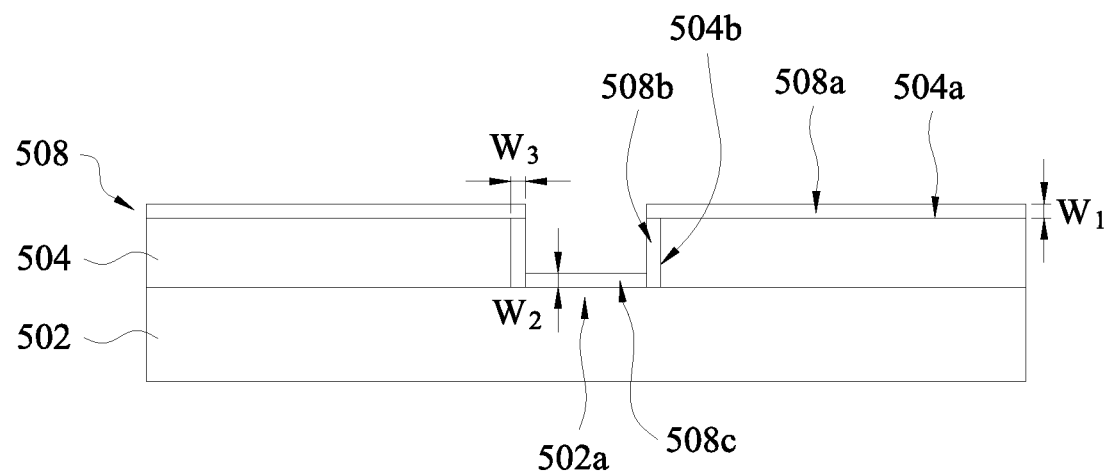

Referring to FIGS. 4 and 5B, method 400 proceeds to block 404 with forming a spacer layer 508 over the mask layer 504 and the opening 506 in the mask layer 504. More specifically, the spacer layer 508 includes multiple segments: 508a, 508b, and 508c and each of the segments overlays a top surface or extends along a sidewall of the mask layer 504 and the substrate 502. For example, the segment 508a overlays top surface 504a of the mask layer 504; the segment 508b extends along sidewall 504b of the mask layer 504; the segment 508c overlays a portion of top surface 502a of the substrate 502. In a specific embodiment, the spacer layer 508 is a conformal layer, which means that each of the segments of such layer 508 shares a thickness that is substantially similar or the same. In the illustrated embodiment, the segment 508a has a thickness $W_1$; the segment 508b has a thickness $W_3$; the segment 508c has a thickness $W_2$, and $W_1$, $W_2$, and $W_3$ are substantially similar or the same.

Still referring to FIG. 5B, the conformal spacer layer 508 may be formed by using any of a variety of deposition processes such as, for example, a physical vapour deposition (PVD) process, a chemical vapour deposition (CVD) process, and an atomic layer deposition (ALD) process. The conformal spacer layer 508 may be formed of a material that is similar to or different than the material of the mask layer 504 such as, for example, silicon nitride ($SiN_x$) and/or silicon oxide ($SiO_x$). In some alternative embodiments, the conformal spacer layer 508 is formed of a material that may have a different etching selectivity than the material of the mask layer 504 has.

Figure 5C:
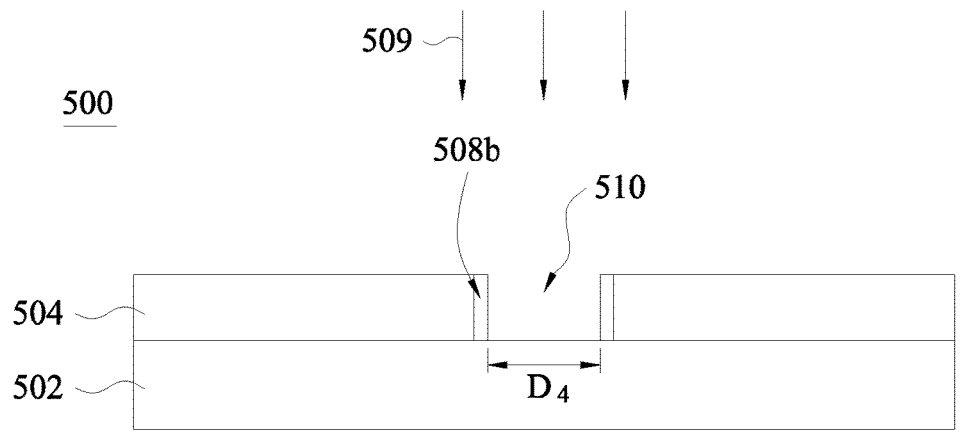

Referring back to FIG. 4, method 400 proceeds to block 406 with removing horizontal segments of the conformal spacer layer 508 by an etching process 509. In some embodiments, the etching process 509 may include an anisotropic etching process (e.g., a dry etching process). As illustrated in FIG. 5C, after applying such an anisotropic etching process 509, the segments 508a and 508c of the conformal layer 508 (i.e., the horizontal segments) have been removed from the top surface 504a of the mask layer 504 and the portion of the top surface 502a of the substrate 502 while the segment 508b along the sidewall 504b of the mask layer 504 remains. As such, a new opening 510 with diameter $D_4$ is formed where $D_4$ is less than $D_3$. Moreover, the diameter $D_4$ of the opening 510 may be determined by the thickness of the remaining conformal layer 508 (e.g., $W_3$) and the diameter of the opening 506 ($D_3$), that is, $D_4=D_3-2\times W_3$. In some embodiments, the anisotropic etching process 509 may include using a plasma (e.g., a $CF_4$ plasma) etching process at about 50° C. for about 15 seconds.

Figure 5D:
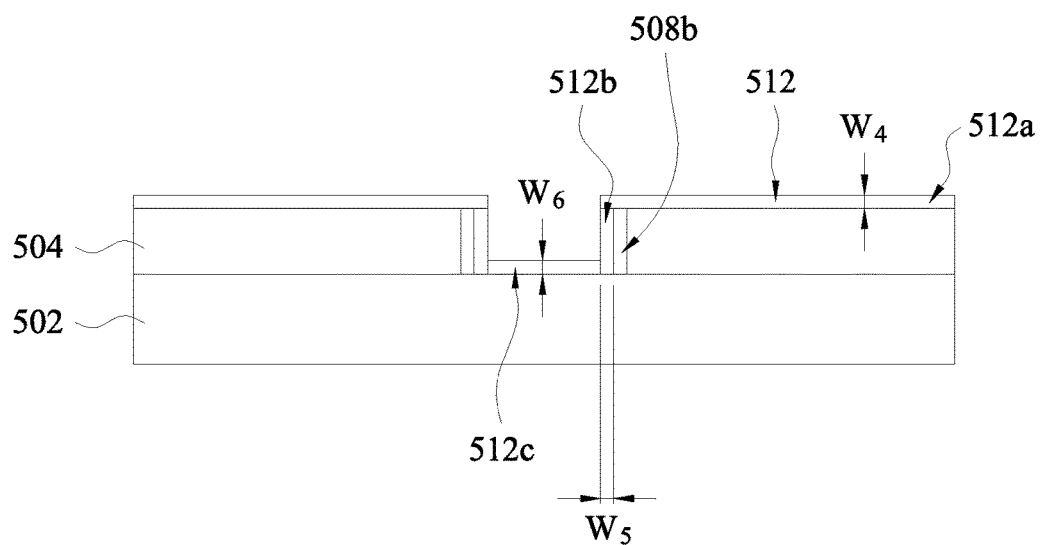

Referring now to FIGS. 4 and 5D, method 400 proceeds to block 408 by forming a spacer layer 512 over the mask layer 504, the remaining conformal spacer layer 508b, and the opening 510. Similar to the conformal spacer layer 508 formed at block 404, spacer layer 512 includes multiple segments: 512a, 512b, and 512c, and each of these segments overlays a top surface or extends along a sidewall of the mask layer 504, the remaining conformal spacer layer 508b, and the substrate 502. As illustrated in FIG. 5D, the segment 512a overlays top surface 504a of the mask layer 504; the segment 512b extends along a sidewall of the remaining conformal layer 508b; the segment 512c overlays a portion of the top surface of the substrate 502. In a specific embodiment, the layer 512 is a conformal layer, which means that each of the segments of such layer 512 shares a thickness that is substantially similar or the same. In the illustrated embodiment, the segment 512-a has a thickness $W_4$; the segment 512-b has a thickness $W_5$; the segment 512-c has a thickness $W_6$, and $W_4$, $W_5$, and $W_6$ are substantially similar or the same.

Still referring to FIG. 5D, the conformal spacer layer 512 may be formed by using any of a variety of deposition processes such as, for example, a physical vapour deposition (PVD) process, a chemical vapour deposition (CVD) process, and an atomic layer deposition (ALD) process. The conformal spacer layer 512 may be formed of a material that is similar to or different than the material of the mask layer 504 and the conformal layer 508 such as, for example, silicon oxide ($SiO_x$). In some alternative embodiments, the conformal spacer layer 512 is formed of a material that may have a different etching selectivity than the material of the mask layer 504 has.

Figure 5E:
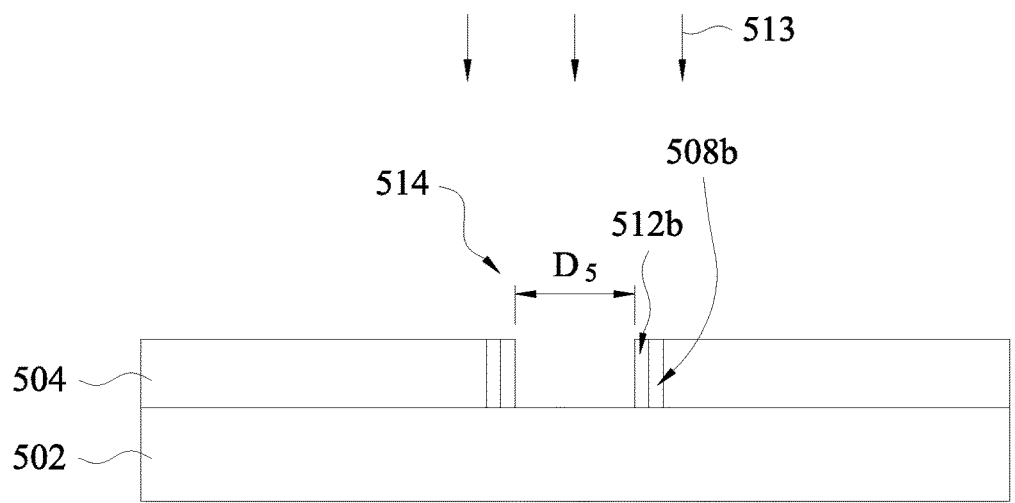

Referring back to FIG. 4, method 400 proceeds to block 410 with removing horizontal segments of the conformal spacer layer 512 by an etching process 513. In some embodiments, the etching process 513 may include an isotropic etching process (e.g., a dry etching process). As illustrated in FIG. 5E, after applying such an anisotropic etching process 513, the segments 512a and 512c of the conformal spacer layer 512 (i.e., the horizontal segments) have been removed from the top surface 504a of the mask layer 504 and the portion of the top surface 502a of the substrate 502 while the segment 512b along the sidewall of the remaining conformal layer 508b remains. As such, a new opening 514 with diameter $D_5$ is formed where $D_5$ is less than $D_4$. Moreover, the diameter $D_5$ of the opening 514 may be determined by the thickness of the remaining conformal layer 508 ($W_3$), the thickness of the remaining conformal layer 512-b ($W_5$), and the diameter of the opening 506 ($D_3$), that is, $D_5=D_3-2\times W_3-2\times W_5$. In some embodiments, the anisotropic etching process 513 may include using a plasma (e.g., a $CF_4$ plasma) etching process at about 50° C. for about 15 seconds.

Figure 5F:
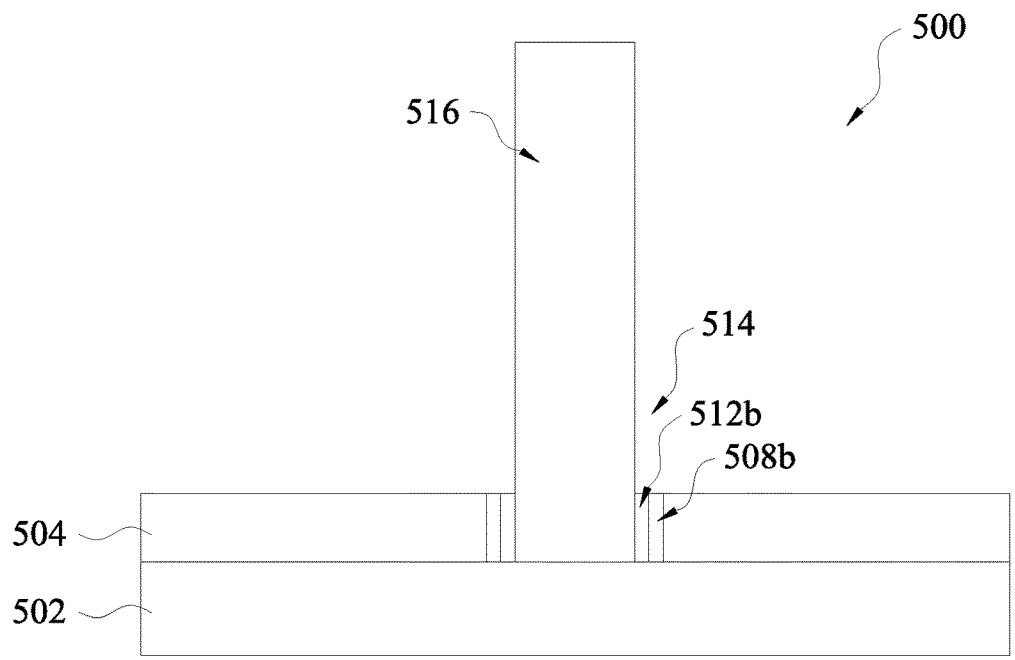

Referring now to FIGS. 4 and 5F, method 400 proceeds to block 412 with forming a nanowire 516 through the opening 514. In some embodiments, the nanowire 516 may be formed of a material that is the same or different than the material of the substrate 502. In an example, the nanowire 516 may be formed of III/V or II-VI compound materials (e.g., InAs, GaAs, InP, GaN, etc.) while the material of the substrate is formed of silicon. In another example, the nanowire 516 may be formed of silicon while the material of the substrate is also formed of silicon. Yet in another example, the nanowire 516 may be formed of silicon with a first crystalline orientation (e.g., <111>) while the material of the substrate is also formed of silicon but with a second crystalline orientation (e.g., <001>). As such, the nanowire 516 may include at least one of a variety of materials such as, for example, silicon, germanium, InAs, InP, GaAs, GaSb, InSb, GaP, InGaAs, InGaP, or a combination thereof. In a specific embodiment, the forming the nanowire 516 through the opening 514 may include a selective area growth metal organic chemical vapour deposition (SAG-MOCVD) or metal organic vapour phase epitaxy (SAG-MOVPE) growth while any of a variety of deposition approaches (e.g., CVD, MOCVD) may be used and remaining within the scope of the present disclosure. In an embodiment, since the nanowire 516 is formed following the opening 514, the nanowire 516 may include a curvilinear cross-section and such a curvilinear nanowire 516 may has a diameter that is approximately the same as the diameter $D_5$.

Figure 5G:
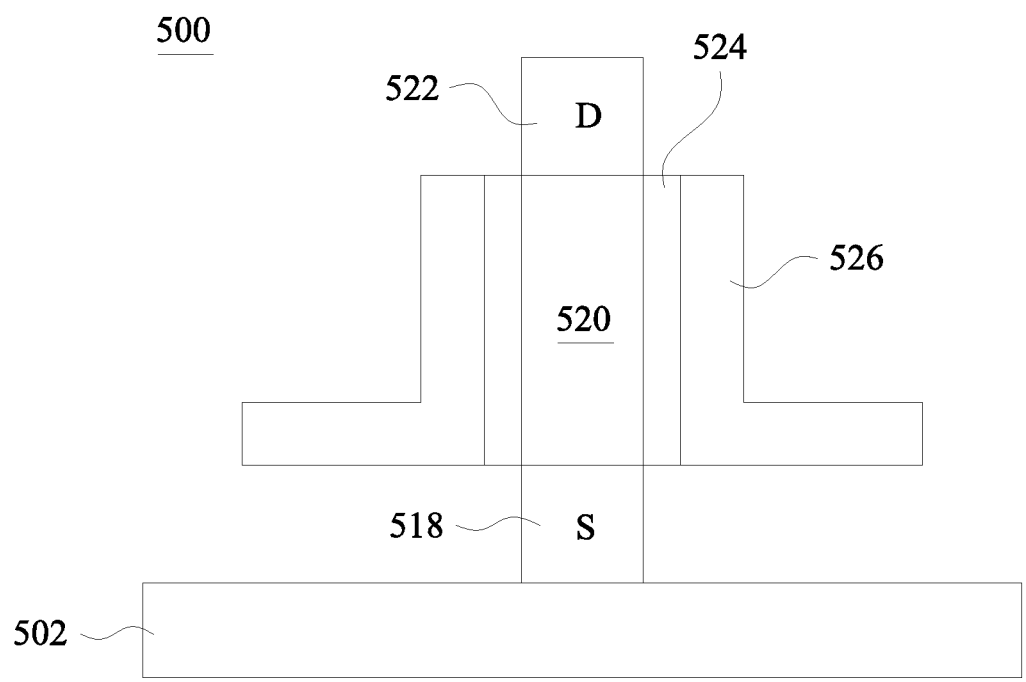

Referring to FIGS. 4 and 5G, method 400 may then proceed to block 414 that includes further fabrication steps. In an example in which the device 500 is a vertical FET, a source feature 518, a channel region 520, and a drain feature 522 may be formed in the nanowire 516. Accordingly, gate dielectric layer 524 and gate contact 526 may be formed to wrap the channel region 520. Such fabrication steps may result in the device 500 to be formed as an element of a vertical FET.

The embodiments of the current disclosure provide various advantages to form a nanowire-based device. In an example, by combing the SAG-MOCVD approach to grow nanowire(s) through a patterned mask layer and the digital etching process to trim size of the grown nanowire(s) (e.g., diameter), nanowire(s) with a reduced diameter may be formed. Subsequently, using a pattern based on the nanowire (s) with the reduced diameter, nanowire(s) with further reduced diameter may be formed. By forming ultrathin nanowire(s) with such an approach, damages, caused by etching processes (e.g., the digital etching process), on surface(s) of the nanowire(s) may be advantageously avoided. In another example, by sequentially forming one or more conformal layers over a patterned mask layer followed by an anisotropic etching process, a mask layer that includes pattern(s) with reduced size may be formed. Further, by using the SAG-MOCVD approach to grow nanowire(s) through the pattern(s) with reduced size, a nanowire-based device that includes nanowire(s) with ultrathin diameter may be formed. Advantages provided by such a method to fabricate a nanowire-based device include defect-free surface(s) of nanowires because of an absence of etching processes being applied to the surface(s) of the nanowire(s).

Various embodiments of a method of fabricating a nanowire-based device are disclosed. In an embodiment, the method includes forming a first mask layer over a substrate; forming a first opening in the first mask layer; growing a first nanowire that protrudes through the first opening in the first mask layer, wherein the first nanowire has a first diameter; removing the first mask layer; oxidizing a sidewall of the first nanowire; etching the oxidized sidewall of the first nanowire; forming a second mask layer overlaying the substrate; removing the first nanowire thereby forming a second opening in the second mask layer; and growing a second nanowire that protrudes through the second opening in the second mask layer, wherein the second nanowire has a second diameter and the second diameter is different than the first diameter.

In another embodiment, the method includes forming a first mask layer over a substrate; forming a first opening in the first mask layer thereby exposing a first portion of the substrate; forming a first spacer layer over the first mask layer and in the first opening; removing a portion of the first spacer layer formed in the first opening to thereby form a second opening extending through the first mask layer and a remaining portion of the first spacer layer; forming a second spacer layer over the first mask layer and in the second opening; removing a portion of the second spacer layer formed in the second opening thereby forming a third opening extending through the first mask layer, the remaining portion of the first spacer layer, and a remaining portion of the second spacer layer; and growing a nanowire through the third opening.

Yet in another embodiment, the method includes forming a first mask layer over a substrate; forming a first opening in the first mask layer; growing a first nanowire in the first opening, wherein the first nanowire has a first diameter; removing the first mask layer; oxidizing a sidewall of the first nanowire; etching the oxidized sidewall of the first nanowire; forming a second mask layer overlaying the substrate; removing the first nanowire thereby forming a second opening in the second mask layer; and growing a second nanowire through the second opening in the second mask layer, wherein the second nanowire has a second diameter and the second diameter that is less than the first diameter, wherein the second nanowire extends beyond the second mask layer.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first mask layer over a substrate;
   forming a first opening in the first mask layer;
   growing a first nanowire that protrudes through the first opening in the first mask layer, wherein the first nanowire has a first diameter;
   removing the first mask layer;
   oxidizing a sidewall of the first nanowire;
   etching the oxidized sidewall of the first nanowire;
   forming a second mask layer overlaying the substrate;
   removing the first nanowire thereby forming a second opening in the second mask layer; and
   growing a second nanowire that protrudes through the second opening in the second mask layer, wherein the second nanowire has a second diameter and the second diameter is different than the first diameter.

2. The method of claim 1, wherein the first mask layer includes a material selected from the group consisting of an oxide material and a nitride material.

3. The method of claim 1, wherein the second diameter is less than about 10 nanometers.

4. The method of claim 1, wherein growing the first nanowire includes utilizing a selective growth-metal organic chemical vapor deposition (SG-MOCVD).

5. The method of claim 1, wherein the substrate includes a material selected from the group consisting of: silicon, germanium, and III/V compound materials.

6. The method of claim 1, wherein the first and second nanowires are formed of a material selected from the group consisting of silicon, indium arsenide (InAs), indium phosphide (InP), gallium arsenide (GaAs), gallium antimony (GaSb), indium antimony (InSb), gallium phosphide (GaP), and/or a combination thereof.

7. The method of claim 1, wherein the first nanowire is formed of a different material than the second nanowire.

8. The method of claim 1, wherein removing the first nanowire includes performing one of a wet etching process and a thermally evaporating process.

9. A method comprising:
   forming a first mask layer over a substrate;
   forming a first opening in the first mask layer;
   growing a first nanowire in the first opening, wherein the first nanowire has a first diameter;
   removing the first mask layer;
   oxidizing a sidewall of the first nanowire;
   etching the oxidized sidewall of the first nanowire;
   forming a second mask layer overlaying the substrate;
   removing the first nanowire thereby forming a second opening in the second mask layer; and
   growing a second nanowire through the second opening in the second mask layer, wherein the second nanowire has a second diameter that is less than the first diameter, wherein the second nanowire extends beyond the second mask layer.

10. The method of claim 9, wherein the second diameter is less than about 10 nanometers.

11. The method of claim 9, wherein the substrate includes a material selected from the group consisting of silicon, germanium, and III/V compound materials.

12. The method of claim 9, wherein the first nanowire is formed of a different material than the second nanowire.

13. A method comprising:
   forming a first mask layer over a substrate;
   forming a first opening in the first mask layer;
   forming a first nanowire in the first opening, wherein the first nanowire has a first width;
   removing the first mask layer;
   reducing the width of the first nanowire to form a modified first nanowire having a second width that is less than the first width;
   forming a second mask layer around the modified first nanowire;
   removing the modified first nanowire thereby forming a second opening in the second mask layer; and
   forming a second nanowire through the second opening in the second mask layer.

14. The method of claim 13, wherein the second opening has the second width, and wherein the second nanowire has the second width.

15. The method of claim 13, wherein the second nanowire extends beyond the second mask layer.

16. The method of claim 13, wherein reducing the width of the first nanowire to form the modified first nanowire includes:
   oxidizing a portion the first nanowire, and
   removing the oxidized portion of the first nanowire.

17. The method of claim 13, wherein removing the modified first nanowire thereby forming the second opening in the second mask layer includes performing a thermal treatment process to remove the modified first nanowire.

18. The method of claim 13, wherein reducing the width of the first nanowire to form the modified first nanowire having the second width that is less than the first width occurs after removing the first mask layer.

19. The method of claim 13, wherein the first nanowire is formed of a different material than the second nanowire.

\* \* \* \* \*